US009521794B2

(12) United States Patent
Sibuet

(10) Patent No.: US 9,521,794 B2
(45) Date of Patent: Dec. 13, 2016

(54) METHOD FOR PRODUCING A MICROELECTRONIC DEVICE

(71) Applicant: COMMISSARIAT A L'ENERGIE ATOMIQUE ET AUX ENE ALT, Paris (FR)

(72) Inventor: Henri Sibuet, La Buisse (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 198 days.

(21) Appl. No.: 14/193,291

(22) Filed: Feb. 28, 2014

(65) Prior Publication Data
US 2014/0240939 A1    Aug. 28, 2014

(30) Foreign Application Priority Data

Feb. 28, 2013   (FR) ...................................... 13 51779

(51) Int. Cl.
H05K 3/02   (2006.01)
H05K 3/10   (2006.01)
(Continued)

(52) U.S. Cl.
CPC ......... H05K 13/046 (2013.01); H01L 23/5223 (2013.01); H01L 28/91 (2013.01); H01L 27/0203 (2013.01); H01L 2924/0002 (2013.01)

(58) Field of Classification Search
CPC ... H05K 13/046; H01L 28/91; H01L 23/5223; H01L 27/10861; H01L 28/40; H01L 27/0203; H01L 2924/0002; H01L 2924/00; Y10T 29/49126; Y10T 29/49155; Y10T 29/49165; Y10T 29/49204
(Continued)

(56) References Cited

U.S. PATENT DOCUMENTS 6,437,385 B1 * 8/2002 Bertin ............... H01L 27/10861
                                                         257/301
8,722,505 B2 * 5/2014 Hopper .................. H01L 28/91
                                                         257/E27.048
(Continued)

FOREIGN PATENT DOCUMENTS

EP           0 581 475 A1    2/1994
WO    WO 2011/090440 A1    7/2011

OTHER PUBLICATIONS

European Search Report issued May 9, 2014, in European Patent Application No. 14155318.0.
(Continued)

Primary Examiner — Donghai D Nguyen
(74) Attorney, Agent, or Firm — Oblon, McClelland, Maier & Neustadt, L.L.P.

(57) ABSTRACT

A method for producing a microelectronic device including a substrate and a stack having at least one electrically conductive layer and at least one dielectric layer. The method includes formation, from one face of the substrate, of at least one pattern that is in depression with respect to a plane of the face of the substrate, the wall of the pattern having a bottom part and a flank part, the flank part being situated between the bottom part and the face of the substrate, the flank part having at least one inclined wall as far as the face of the substrate. With formation of the stack, the layers of the stack helping at least partially fill in the pattern. The stack is thinned of the stack at least as far as the plane of the face of the substrate so as to completely expose the edge of said at least one electrically conductive layer flush in one plane, and at least one electrical connection member is formed on the substrate in contact with the edge of the at least one electrically conductive layer.

15 Claims, 4 Drawing Sheets

(51) Int. Cl.
*H05K 13/04* (2006.01)
*H01L 49/02* (2006.01)
*H01L 23/522* (2006.01)
*H01L 27/02* (2006.01)

(58) Field of Classification Search
USPC .......... 29/830, 846, 847, 874; 257/301, 302; 438/387, 396
See application file for complete search history.

(56) References Cited

U.S. PATENT DOCUMENTS

| | | |
|---|---|---|
| 9,196,672 B2* | 11/2015 | Tran .................. H01L 28/40 |
| 2006/0115952 A1 | 6/2006 | Wu |
| 2010/0044831 A1 | 2/2010 | Guegan |
| 2011/0233722 A1 | 9/2011 | Liang et al. |
| 2012/0104548 A1 | 5/2012 | Hopper et al. |
| 2012/0257324 A1 | 10/2012 | Ma et al. |

OTHER PUBLICATIONS

French Preliminary Search Report issued Sep. 25, 2013 in French Application 13 51779, filed on Feb. 28, 2013 (with English Translation of Categories of Cited Documents and Written Opinion).

* cited by examiner

METHOD FOR PRODUCING A MICROELECTRONIC DEVICE

FIELD OF THE INVENTION

The present invention concerns in general the formation of electrical contact points on each of the conductive layers of stratified structures alternating insulating and conductive layers and more particularly the production of multilayer capacitors or dense routing structures.

PRIOR ART

The microelectronics industry normally uses stratified structures of the metal/insulator/metal (MIM) type where layers, alternately insulating and conducting, are stacked in particular to form high-value capacitors at reasonable cost because of the economy of surface area that the superimposition of these layers affords.

Structures of this type have already been described, in particular those based on the use of thin layers of ceramics separated by conductive sheets to produce high-value capacitors. For the lateral contact point, in order to connect all the conductive electrodes so as to put the individual capacitors in parallel, it is necessary to have recourse to means that do not come from microelectronics. The techniques employed are in general complicated and therefore expensive, such as those described for example in the patent application filed with the American Patent and Trademark Office, or USPTO, under the reference US 2012/0257324 A1.

The practical implementation of the above MIM structures that make it possible to put in parallel electrically the capacitors associated with each of the dielectric layers, thus increasing, for the same surface area occupied, the value of the capacitance, thus comes up against the difficulty of having to interconnect the conductive layers with each other in order to form the electrodes of the capacitors.

The publications US 2012/014548 A1 and WO 2011/090440 A1 for their part disclose methods of manufacturing capacitors with, using a cavity in a substrate, the formation of stacks alternating conductive and non-conductive parts with an interleaving of these conductive parts in a comb. The devices resulting therefrom comprise connection pins applied to the only part of the conductive parts fitting flush with the surface of the substrate. It is thus possible to produce capacitors based on several conductive layers connected together in alternation (two successive conductive layers are never connected electrically) so as to offer high capacitive values with reduced size. Nevertheless the connection by pins applied on the surface involves complex preparation, causing markings and/or etchings, for manufacturing the conductive layers.

One object of the invention is therefore to describe a device and method for implementation that makes it possible to respond to this problem without increasing the number of steps of the method and, advantageously, using traditional means used by the microelectronic industry Other objects, features and advantages of the present invention will emerge from an examination of the following description and accompanying drawings. Naturally other advantages may be incorporated.

SUMMARY OF THE INVENTION

A first aspect of the invention relates to a method for producing a microelectronic device comprising a substrate and a stack comprising at least one electrically conductive layer and at least one dielectric layer.

It advantageously comprises the following steps:
- formation, from one face of the substrate, of at least one pattern that is in depression with respect to a plane of the face of the substrate, the wall of the pattern comprising a bottom part and a flank part, the flank part being situated between the bottom part and the face of the substrate, the flank part comprising at least one inclined wall as far as the face of the substrate,
- formation of the stack, the layers of the stack helping to at least partially fill in the pattern, the step of formation of the stack preferably being performed over the entire surface of the face of the substrate,
- thinning of the stack at least as far as the plane of the face of the substrate so as to completely expose the edge of said at least one electrically conductive layer flush in one plane,
- formation of at least one electrical connection member on the substrate in contact with the edge of said at least one electrically conductive layer while completely leaving the edge of said at least one electrically conductive layer flush in said plane.

According to the invention microelectronics means all microelectronic and nanoelectronic techniques.

By virtue of the invention, the conductive layers, alternating with insulating layers, can be made accessible from the outside, through the face of the substrate, in the same plane. This appreciably facilitates the work of subsequent connection, the contact points being produced in the plane of the surface of the substrate. Thinning is advantageously done by means of a single step such as levelling by planing. Likewise, the successive depositions are advantageously of the "solid plate" type so that manufacture is greatly simplified.

Furthermore, since the method makes it possible to obtain an electrical connection with one or more conductive layers having their edges completely exposed on the surface, complex steps of preparation of the layers involving a plurality of masks or etchings after the deposition of the layers are avoided. In an advantageous case, the invention can be implemented with a single mask forming a pattern defining a single opening, simplified successive depositions and finalisation for the electrical connection that is both rapid and flexible with regard to the connection configurations that can be achieved.

Another aspect of the invention relates to a microelectronic device comprising a substrate and a stack comprising successively at least one electrically conductive layer, a dielectric layer and another electrically conductive layer. Advantageously, the substrate comprises a pattern that is in depression with respect to a plane of a face of the substrate, the wall of the pattern comprising a bottom part and a flat part, the front part being situated between the bottom part and the face of the substrate, the flank part preferentially comprising at least one inclined wall splaying as far as the face of the substrate, a pattern in which the stack is situated, a first layer of the stack entirely covering the cavity defined by the pattern, any other layer in the stack entirely covering a layer of the stack that lies immediately under it, the edge of the at least one electrically conductive layer being completely exposed at the face of the substrate flush in one plane and connected to an electrical connection member.

Another aspect of the invention relates to a system comprising an integrated circuit provided with at least one connection pin for said integrated circuit, at least one input/output pad and at least one device according to the invention, one of the connection members of which is connected to the connection pin and another of the connection members of which is connected to said input/output pad.

BRIEF DESCRIPTION OF THE FIGURES

The aims and objects as well as the features and advantages of the invention will emerge more clearly from the detailed description of an embodiment of the latter that is illustrated by the following accompanying drawings, in which.

Figure 1:
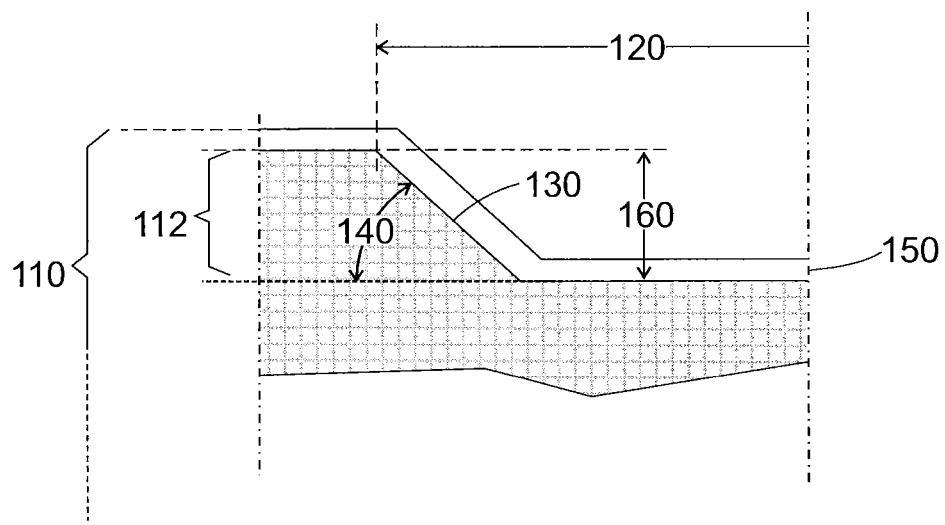
FIG. 1 illustrates the principle of production of a stack of a device according to the invention.

The accompanying drawings are given by way of examples and are not limitative of the invention.

DETAILED DESCRIPTION OF THE INVENTION

Before beginning a detailed review of embodiments of the invention, purely optional features that can if necessary be used in association according to all combinations with each other or alternatively, are stated below:
- the face of the substrate being electrically conductive, the stack is formed on the substrate with successively at least one alternation of an insulating layer and an electrically conductive layer;
- the wall of the pattern is electrically insulating and the stack is formed on the substrate with successively at least one alternation of an electrically conductive layer, a dielectric layer and an electrically conductive layer;
- the inclined wall is a flat surface;
- the angle formed between the inclined wall and the plane of the face of the face of the substrate is selected between 30° and 90°;
- the inclined wall is formed so as to splay as far as the face of the substrate from the wall of the bottom;
- the step of forming an electrical connection member comprises:
  - the deposition of an electrically insulating material in which, by photolithography and etching, for at least one edge of an exposed electrically conductive layer of the stack, at least one opening is defined to provide an electrical contact point on said edge;
  - the deposition of an electrically conductive material to form the electrical connection member, said deposition being configured so as to pass through at least one opening;
- the stack comprises two electrically conductive layers spaced apart by a dielectric layer, the at least one opening being configured so as to provide a contact point on the edge of a first of the two electrically conductive layers without providing a contact point on a second one of the two electrically conductive layers;
- it comprises a second opening configured so as to provide a contact point on the edge of the second of the two electrically conductive layers without providing a contact point on the first of the two electrically conductive layers;
- it comprises, before the formation of the stack, and after formation of the in depression pattern, the formation of an electrically insulating layer finalising the substrate.
- the step of forming the stack is performed over the entire surface of the face of the substrate and the thinning step comprises smoothing; the smoothing may stop on a stop plane advantageously on or under the surface of the layer 150 if it is present or on or under the surface of the base substrate underlying the layer 150;
- the layers in the stack are continuous. They are therefore advantageously layers that cover the entire surface of the cavity;
- the thinning step comprises a levelling;
- the step of forming the pattern comprises a step of etching the substrate;
- the method concerns the manufacture of a multilayer capacitive device;
- the method concerns the manufacture of a device for routing and/or for the electrical supply of a component;
- the electrical connection member comprises at least first and second electrical contacts, each of these contacts electrically connecting a distinct series of conductive layers of said stack, each distinct series of conductive layers forming a capacitance electrode or an electrical routing;
- the successive depositions are identical;
- the step of forming the pattern comprises a step of etching the substrate;
- two electrically conductive layers are electrically connected in series with the dielectrics so as to form the electrodes of a capacitor;
- the edge of at least one electrically conductive layer is connected to at least two connection members so as to form an electrical routing;
- one of the two connection members can be connected to an input/output pad of an integrated circuit (CI) and the other one of the two connection members can be connected to a connection pin of said integrated circuit;
- the bottom wall is flat,
- the substrate is conductive and, before the successive depositions, a layer of electrically insulating material is deposited,
- the substrate is electrically insulating,
- the stack comprises more than two conductive layers and at least two dielectric layers each interposed between two conductive layers,
- the in depression pattern is a cavity and advantageously comprises two inclined walls on the parts of the flank that are opposite relative to the bottom part,
- the whole of the flank part is inclined, the last layer of the successive depositions is conductive, a depth of the pattern is equal to or greater than the thickness of the stack.

The system also concerns a system comprising an integrated circuit (CI) provided with at least one input/output pad and at least one connection pin and at least one device one of the first and second electrical contacts of which is connected to the connection pin and the other one of the first and second electrical contacts of which is connected to said input/output pad.

In the context of the present invention, the terms "on" or "above" do not necessarily mean "in contact with". Thus, for example, the successive deposition of a plurality of layers above a wall of a cavity forming a in depression pattern does not necessarily mean that the plurality of layers and said wall are directly in contact with one another, but this means that the plurality of layers at least partially covers a wall while being either directly in contact or separated from it by another layer, such as an insulating layer, or another element.

In general terms, height means a dimension situated along the thickness of the substrate. The substrate generally comprises two opposite faces around its thickness, one of the faces being used for implementing the invention. This face is advantageously flat, along a plane advantageously perpendicular to the thickness of the substrate.

The term in depression pattern means all geometric configurations for which a re-entrant shape in the thickness of the substrate is formed. It will in particular be a cavity of the non-through hole type. The depth thereof means the dimension thereof into the thickness of the substrate. The substrate is in general terms the part of the support used during steps of manufacturing the device and at least part of which is kept at the end of the manufacture in order to participate in said device.

According to one aspect of the invention, the in depression pattern makes it possible to deposit at least some of the conductive layers while giving them a concave shape rising towards the face of the substrate so that the layer or layers in question are, at the plane of the face of the substrate, oriented so that their edge is in the plane of said face. The term edge means here a rim portion of a layer of the stack.

FIG. 1 illustrates the principle of producing a multilayer structure according to the invention that is made starting from a substrate 110 having a base part possibly comprising one or more layers in which first of all, advantageously by etching, a pattern 120 is produced defining the geometric form of the in depression or cavity that is created in this way in a portion 112 of the thickness of the substrate from its surface. FIGS. 3 to 9 show more completely an example of a in depression pattern form in which the pattern comprises a bottom wall, here flat and parallel to the plane of the substrate 110, and a flank part. The latter joins the face of the substrate from the bottom part. In cross section along a plane parallel to the plane of the face of the substrate 110, the pattern may in particular adopt a rectangular contour such as the square contour visible in FIG. 8 or the elongate profile in FIG. 9. The etching is preferably adjusted so that the cavity is in depressioned out with at least one inclined portion 130, preferably flat, of the flank part.

In a first embodiment, the inclination is such that the inclined portion 130 splays as far as the face of the substrate 110.

In another embodiment, the inclination is inverse and the inclined portion is re-entrant, in the direction of the face of the substrate 110 relative to the bottom of the cavity. For example, the angle of the inclined wall 130 may be between 0° and 60° in the first case and between 0° and −60° in the second case, relative to the normal to the face of the substrate 110.

There may be several inclined walls 130 spaced apart or not on the part of the flank. They may for example be facets, the facets being able to have different inclinations. Furthermore, the inclined walls are not necessarily flat and inclined wall means that the layer or layers are, by virtue of the inclined wall, able to rise from the bottom of the pattern 120 as far as the face of the substrate 110, which means that the wall or walls 130 have a non-zero component along the thickness of the substrate 110 (the depth of the pattern 120). In a particular case, at least one wall 130 may have a curved shape in cross section along the thickness of the substrate 110, a curved shape that is for example concave.

In the case of walls 130 that are flat, vis-à-vis the direction of the plane of the face of the substrate, the etching angle 140 is typically between 30° and 90°. In a limit case of the invention, the bottom part is reduced at the intersection of the walls of the part of the flank. For example, a pyramid-shaped cavity can be used, apex downwards, the part of the bottom being the apex.

In particular but not exclusively, if the base of the substrate 110, in its thickness part receiving the pattern 120, is electrically conductive and the first of the layers attached to its surface 112 is, a layer 150 is also disposed participating in this way in the substrate with the base substrate and intended to electrically insulate from the substrate 110 the multilayer structure or stack that will be formed. It should be noted here that the depth of the etching 160 is advantageously such that it is equal to or greater than the global thickness of the stack that will be formed in the following steps of the method, that is to say it must be equal to or greater than the sum of the thicknesses of the pairs of insulating/conductive layers making up the stack that it is wished to manufacture.

The materials that can be used to form all or some of the dielectric elements of the invention are for example silicon (Si) and its oxide ($SiO_2$) or nitride (SiN), which are insulators. Other examples are given below. All the known techniques of growth, deposition and etching of these materials and all those, conductive or insulating, used in microelectronics are possibly employed using substrates that usually consist of or are based on monocrystalline silicon, which are in the form of thin wafers generally referred to by the English term. The patents are defined in particular by photolithography using masks and insolation, possibly using an electron beam (e-beam), electrosensitive resins, or even by printing patterns from moulds (nanoimprint).

In order to obtain the inclined wall or walls 130, recourse can be had typically to chemical etching of the KOH or TMAH type or also an etching of the plasma type that is formed in an etching reactor where the devices to be etched are exposed thereto.

Figure 2:
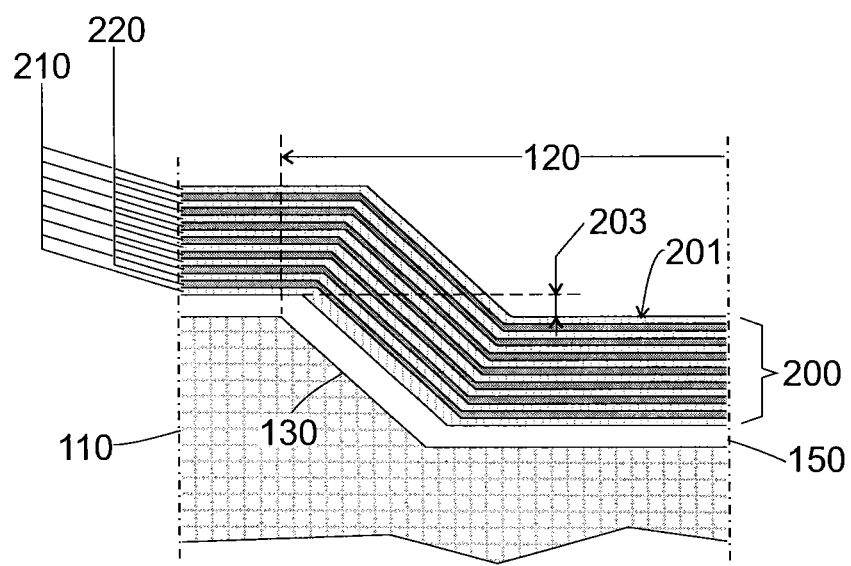
FIG. 2 shows an example of a stack of layers obtained after alternating depositions of conductive layers and insulating layers.

FIG. 2 shows an example of a stack 200 of layers obtained after alternating depositions of conductive layers 210, intended to form the electrodes of the capacitors, and insulating layers 220 constituting the dielectric thereof. As has been seen, the layer 150 insolates if necessary the entire substrate 110, consisting of silicon in this example, and in which first of all, prior to the above depositions, the pattern 120 was etched and the inclined walls 130 were formed. As indicated previously, the etching depth is adapted so that the top surface 201 of the stack of layers remains at a level 203 lower than that of the non-etched parts of the substrate possibly covered, as in this example, with the insulating layer 150 supplementing the base substrate.

The formation of the stack 200 is configured so as to organise a series of conductive layers (at least one if the substrate is conductive in its part delimiting the cavity), this series of layers being put in common with electrically insulating layers, intermediate between the conductive layers so that the conductive layers are electrically insulated by the insulating layer.

By way of example, the insulating layers of the stack 200 may be formed by chemical depositions or processing operations and in particular oxidation or nitriding. Thus the deposition phases may for example be limited to the creation of the conductive layers and then, between each deposition, part of their thickness is treated so as to create insulating layers.

It should be noted here that the successive depositions of the conductive and insulating materials are preferably adapted so as to be identical, that is to say they make it possible to obtain substantially equal deposition thicknesses whatever the orientation of the surfaces on which the deposition occurs. In particular, the thicknesses deposited are substantially the same on the flank of the pattern 120 as outside it. This case is however not limitative of the invention and for example the thickness may be different on the inclined wall or walls 130 relative to the bottom part.

The first layer of the formed stack entirely covers the cavity defined by the in depression pattern 120. The following layers entirely cover the surface of the previous layer.

The conductive materials constituting the electrodes 210 comprise in particular the metals or alloys thereof used in microelectronics: aluminium (Al), gold (Au), copper (Cu), platinum (Pt) and possibly all kinds of materials that are naturally conductive or made conductive, in particular by doping, such as semiconductor materials and in particular doped silicon, or conductive oxides. These materials may be deposited, according to the material, using one or other of the techniques commonly used by the microelectronics industry and which are usually designated by the terms PVD, CVD, PECVD and ALD, ECD, the English acronyms corresponding respectively to "physical vapour deposition", "chemical vapour deposition", "plasma-enhanced chemical vapour deposition", "atomic layer deposition" and "electro-chemical deposition". The deposition may also be done by spin coating, that is to say by centrifugation of the material deposited in liquid or viscous form on the surface of the substrate. The thicknesses deposited are typically in a range of values from 0.2 µm (micrometer, that is to say $0.2 \times 10^{-6}$ meters) to 2 µm.

The materials that may constitute the dielectric layers 220 comprise: silicon nitride (SiN), silicon dioxide ($SiO_2$), alumina ($Al_2O_3$), hafnium oxide ($HfO_2$), ceramics such as lead zirconate titanate (PZT) or barium and strontium titanates (BST). They are for example deposited with the same methods as those mentioned above or by PLD, the acronym for pulsed laser deposition. The thicknesses deposited are typically in a range of values from 10 nm (nanometer, that is to say $10 \cdot 10^{-9}$ meters) to 2 µm.

Figure 3:
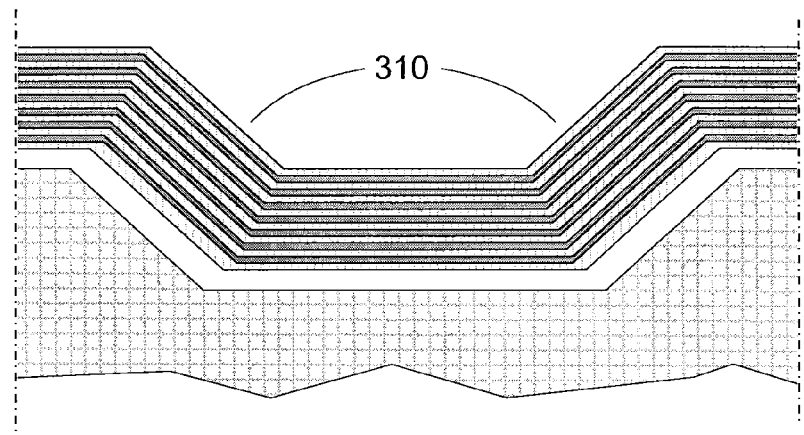
FIG. 3 shows the symmetrical structure of the patterns that is more generally obtained at the end of the preceding steps.

FIG. 3 shows an example of an advantageously symmetrical structure 310 that is obtained at the end of the above steps.

Figure 4:
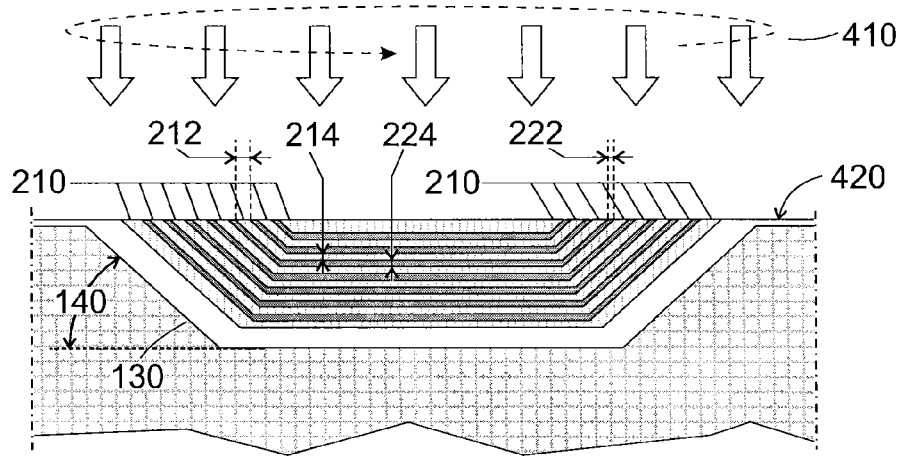
FIG. 4 illustrates the result of the step of thinning the surface of the devices that is typically performed by means of chemical mechanical polishing (CMP)

FIG. 4 illustrates the result of the step of levelling, as far as a stop plane 420, the surface of the devices that is preferably carried out by means of mechanical or mechanical and chemical polishing 410, generally referred by the acronym CMP, standing for chemical mechanical polishing.

The CMP operation 410, or another form of thinning affording the same result, gives access, in a single plane 420, to all the layers of the stack 200 of layers that was formed during the above steps. In particular, it will be possible to access all or some of the conductive layers 210 through their edges. In addition the edge is accessible at every level on the surface. It forms a contour in the form of a closed line and therefore runs over the entire periphery of the layer in question. Preferentially, an upper conductive layer, above the rest of the stack 200, does not require an exposure of its edge and is accessible through its top surface forming the top surface 201 of the stack 200.

It should be noted here that the angle of inclination 140 of the etching wall 130 of the initial pattern 120 controls the width of the edge of the metal layers that have become accessible from the surface 420 that has just been flattened. The available width 212 for the contact points also depends on the thickness 214 that was deposited during the formation of the corresponding conductive layer. It is advantageously wider than this since it is multiplied by the inverse of the sine of the angle 140 formed by the inclined wall 130 of the initial pattern with the plane of the substrate.

For example, if the etching angle 140 is 45° and the thickness 224 of the insulating layer deposited is 0.15 µm, then the flat section or edge 222 of this surface layer is 0.2 µm. Likewise, if the thickness 214 of the conductive layer deposited is for example 0.56 µm, then the flat section or edge 212 of this surface layer is 0.8 µm. For conductive and insulating layers that are all respectively advantageously of the same heights, a repetition step is then obtained that is 0.2+0.8=1 µm. As will be seen in the description of the following steps, it will then be possible to produce contact points in the conductive layers that will for example have a width of 0.3 µm and can be separated by an insulator over a width of 0.7 µm in this case. The photolithography mass that will preferentially afford the contact point on the conductive layers as explained below will be designed accordingly.

The method of the invention therefore provides individual contact points on each of the conductive layers 210 as if the accessible areas had been obtained each separately by photolithography. Every possible electrical configuration of the individual capacitors can thus potentially be achieved in a single photolithography step as will be seen below and in particular the putting of them in parallel in order to obtain the maximum capacitance for the surface of the etched pattern.

Figure 5:
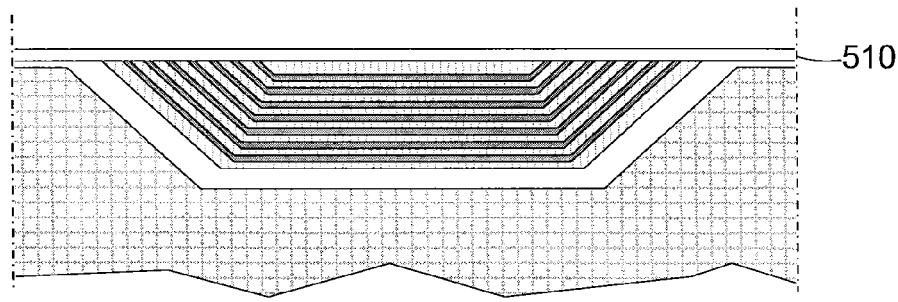
FIG. 5 shows the result of the step where, after CMP, a layer of an insulator in which it will be possible to produce contact points of the conductive layers has just been deposited.

FIG. 5 shows the result of the following step where there has just been deposited, after CMP, a layer 510 of an insulator in which it will be possible to produce, by photolithography and etching, the openings of the contact points that will give access to each of the conductive layers 210. The layer 510 is, for example, made from silicon dioxide ($SiO_2$) which is, for example, deposited by PECVD over a thickness of 200 nm.

Figure 6:
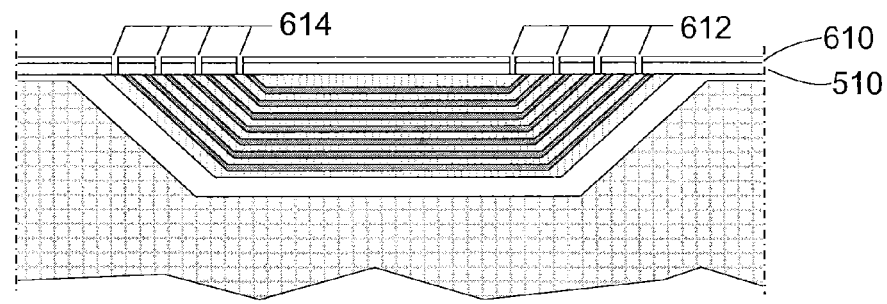
FIG. 6 shows the result of the opening of the contact points in the insulating layer.

FIG. 6 shows the result of the opening for the contact points in the insulation layer 510 that has just been deposited. This step may be performed by means of conventional photolithography operations. The patterns 612 and 614 that define the openings in the insulating layer 510 are first of all transferred into the layer 610, which constitutes a mask that, according to the materials to be etched, is made either from photosensitive resin that has been insulated through a mask or a photolithography reticle and developed, or a so-called hard mask that was itself obtained by photolithography. One or other will enable etching of the underlying material, silicon dioxide in this example. It should be noted here that access to the conductive layers is, in this example, distributed on either side of the stack 200 of layers in order to connect one out of two of the conductive layers on each side and enable all the individual capacitors to be put in parallel in this example.

Figure 7:
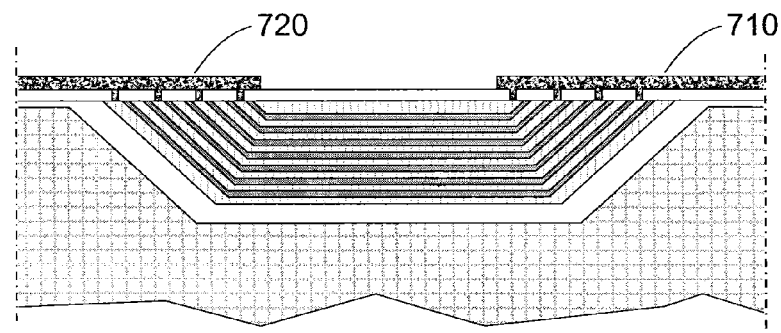
FIG. 7 shows the production of the interconnections on the surface of the device.

FIG. 7 shows the production of the contacts of the connection member providing interconnections on the surface of the device. It is preferably done after removal of the mask 610 and deposition and then etching of a metal layer that provides good electrical contact on the conductive layers that have just been opened. The metals that can be used comprise titanium (Ti), nickel (Ni), gold (Au), aluminium (Al), copper (Cu) and combinations thereof. The metal layer deposited is advantageously included in a range of thicknesses from 0.5 to 2 µm. The patterns of the contacts, 710 and 720 in this example, are for example defined in a standard fashion by photolithography and etching of the chosen material.

Figure 8:
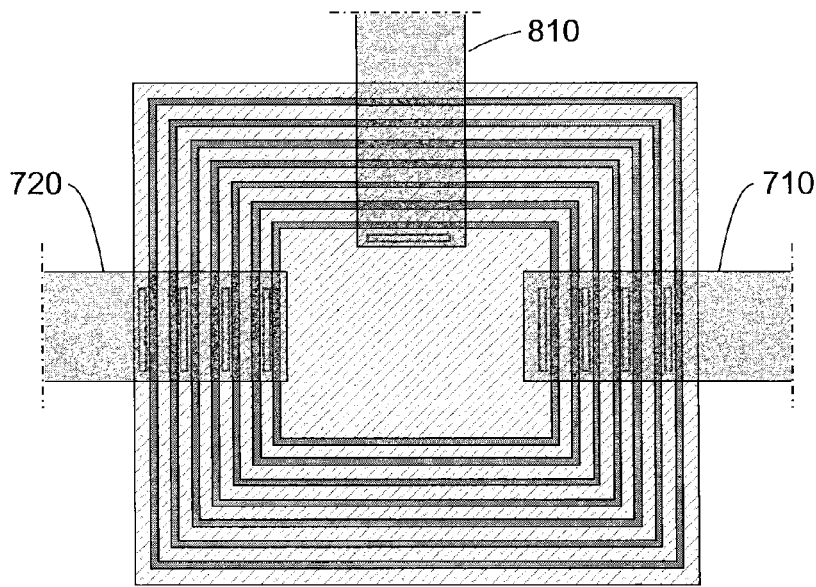
FIG. 8 is a plan view of an example of a device of the capacitor type that can be produced with the method of the invention.

FIG. 8 is a plan view of an example of a device of the capacitive type that can be produced with the method of the invention. The connection member formed by two contacts (also referred to as contact points) 710, 720, which appear in cross section in the previous figure and are situated on opposite sides of the contour of the stack 200, are found therein. The contact points can be made just as well all around the surface of the stack 200, such as for example with the contact 810 disposed on a side of the stack 200 adjacent to the sides provided with the contacts 710, 720.

Advantageously, at least one connection member is, on the surface, configured so as to offer a common electrical connection to several layers and for this purpose it has a surface portion common to several conductive portions each passing through an opening. In the case of a capacitor, one electrical layer out of two is connected to an electrical connection member, another series of electrical layers (the other alternation) being connected to another electrical member. Thus, as can be seen in FIG. 7, two members suffice for the connections of all the layers. A great freedom of shape and placing of the members is offered by the invention, it being recalled that the edge of the layers is accessible on the surface during the step of electrical connection to the members (710, 720, 810). With a member (710, 720, 810) having a single surface portion, it is possible by virtue of the invention to connect conductive layers that are however not successive and/or not to connect in the same area of the surface of the device successive layers that are however flush.

Figure 9:
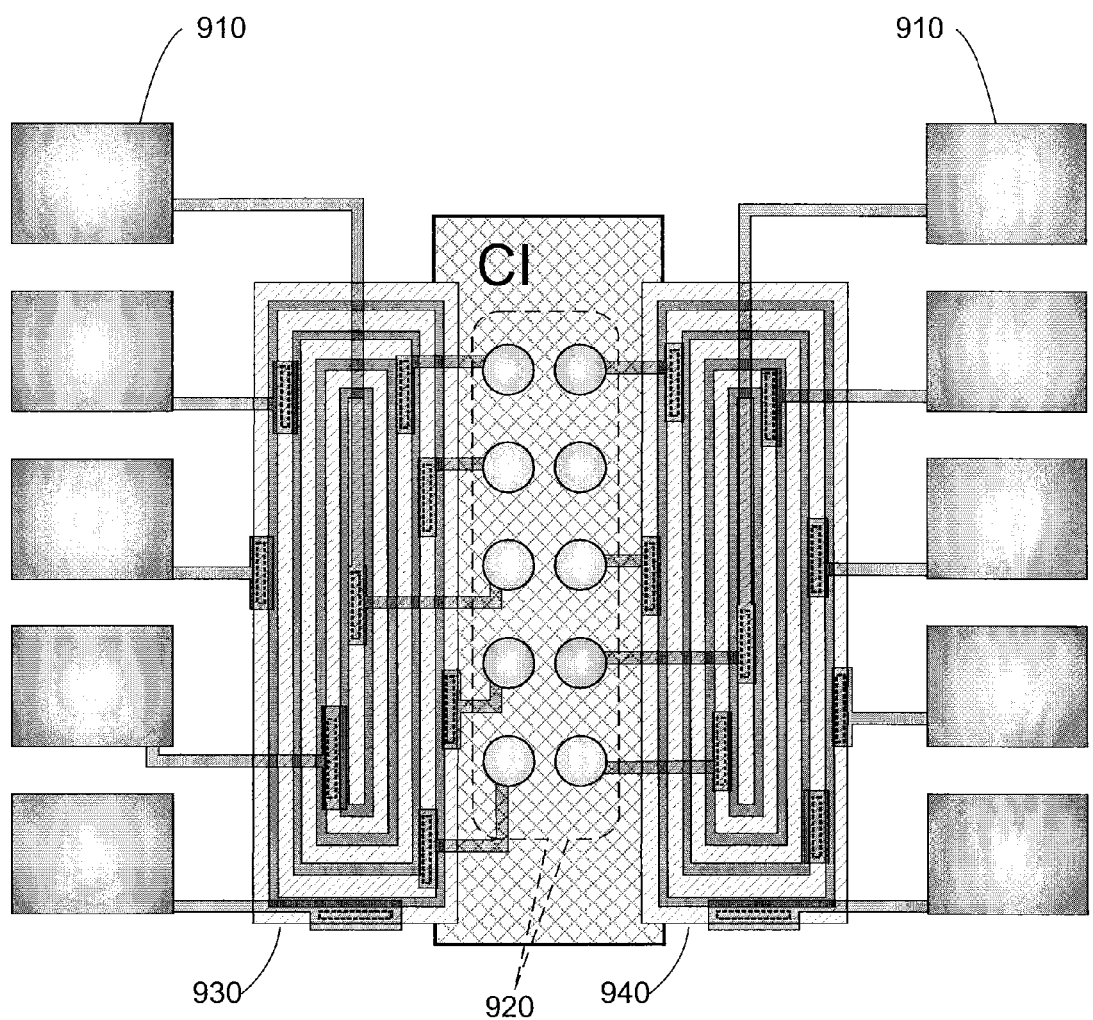
FIG. 9 illustrates an example of use of the invention for implementing routing of high-density connections.

FIG. 9 illustrates an example of use of the invention for effecting a routing of high-density connections between the input/output pads 920 of a module containing an integrated circuit (CI) and the connection pins 910 able to connect the CI to an external circuit. In this example two multilayer stacks are produced, 930 and 940 according to the invention, which interconnect input/output pads and pins without constraints. In this case, the same conductive layer can be connected to several electrical contacts so as to serve as a routing line between several electrical components.

For this type of application of the invention, that is to say for routing high-density interconnections, it becomes advantageous, and unlike the previous application, to limit the capacitances between the various conductive tracks. The multilayer stacks according the invention are then designed so as to limit the facing surfaces and to use dielectric materials with a low dielectric constant such as silicon dioxide ($SiO_2$) for example. Moreover, the maximum thickness of the dielectric layers that is permitted by the technology is preferably used in order to reduce stray capacitances. This may depend on the frequency of the signal transported; for example, a thickness greater than 1 µm is possible and advantageously of a few micrometers.

Apart from the routing applications described above, the multilayer structures according to the invention can advantageously be used in the form of capacitors as energy accumulators or filtering elements in numerous electronic products such as integrated electrical supplies, signal amplifiers and radio-frequency (RF) circuit filters and for all kinds of domestic applications, or by the automobile industry and the telecommunications industry where miniaturisation affords advantages of reliability and a reduction in cost. The devices that can be formed may fit in systems of the micro-electro-mechanical system type referred to as MEMS.

The invention claimed is:

1. A method for producing a microelectronic device comprising a substrate and a stack comprising at least one electrically conductive layer and at least one dielectric layer, the method comprising the following steps:
    forming, from one face of the substrate, at least one pattern in depression with respect to a plane of the face of the substrate, a wall of the pattern comprising a bottom part and a flank part, the flank part being situated between the bottom part and the face of the substrate, the flank part comprising at least one inclined wall as far as the face of the substrate,
    forming the stack, layers of the stack at least partially filling in the pattern, the forming of the stack being performed over the entire surface of the face of the substrate,
    thinning the stack at least as far as the plane of the face of the substrate so as to completely expose opposing edges of each of said at least one electrically conductive layer flush in one plane,
    after the thinning, forming at least one electrical connection member on the substrate in contact with one of the opposing edges of said at least one electrically conductive layer while completely leaving the one of the opposing edges of said at least one electrically conductive layer flush in said plane, wherein the step of forming an electrical connection member comprises: depositing an electrically insulating material on said one of the opposing edges of the electrically conductive layer of the stack, forming at least one opening in the electrically insulating material to provide an electrical contact point on said one of the opposing edges; and depositing an electrically conductive material to form the electrical connection member, said deposition being configured so as to pass through the at least one opening.

2. A method according to claim 1, wherein, the face of the substrate is electrically conductive, the stack is formed on the substrate with successively at least one alternation of an insulating layer and an electrically conductive layer.

3. A method according to claim 1, wherein the wall of the pattern is electrically insulating, and the stack is formed on the substrate with successively at least one alternation of an electrically conductive layer, a dielectric layer and an electrically conductive layer.

4. A method according to claim 1, in which the at least one inclined wall is formed from a flat surface.

5. A method according to claim 1, wherein the angle formed between the at least one inclined wall and the plane of the face of the substrate is selected as between 30° and 90°.

6. A method according to claim 1, wherein the step of forming at least one opening comprises forming said at least one opening in the electrically insulating material by photography and etching.

7. A method according to claim 6, wherein the stack comprises two electrically conductive layers spaced apart by a dielectric layer, the at least one opening being configured so as to provide a contact point on the edge of a first of the two electrically conductive layers without providing a contact point on a second one of the two electrically conductive layers.

8. A method according to claim 7, further comprising forming a second opening configured to provide a contact point on the edge of the second of the two electrically conductive layers without providing electrical connection with said contact point on the first of the two electrically conductive layers.

9. A method according to claim 1, comprising, before forming the stack, and after form ng the in depression pattern, forming a dielectric layer finalizing the substrate.

10. A method according to claim 1, wherein the step of forming the pattern comprises a step of etching the substrate.

11. A method according to claim 1, further comprising for manufacturing a multilayer capacitive device from said microelectronic device.

12. A method according to claim 1, further comprising manufacturing a device for routing and/or for providing an electrical supply of a component from said microelectronic device.

13. A method according to claim 1, wherein the thinning step comprises a levelling.

14. The method of claim 1, wherein said thinning the stack comprises completely exposing all edges of said at least one electrically conductive layer flush in one plane.

15. The method of claim 1, wherein said thinning the stack exposes the entire border of each layer in the stack, said border forming an exposed closed outline.

* * * * *